(12) United States Patent
Wang et al.

(10) Patent No.: US 9,172,358 B1
(45) Date of Patent: Oct. 27, 2015

(54) ISOLATION CIRCUIT

(71) Applicant: VIA TECHNOLOGIES, INC., New Taipei (TW)

(72) Inventors: Peng Wang, Beijing (CN); Jia-Lin Xu, Beijing (CN)

(73) Assignee: VIA TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 14/460,762

(22) Filed: Aug. 15, 2014

(30) Foreign Application Priority Data

Apr. 16, 2014 (CN) .......................... 2014 1 0151995

(51) Int. Cl.
*G01R 31/28* (2006.01)
*H03K 3/037* (2006.01)

(52) U.S. Cl.
CPC .................... *H03K 3/0375* (2013.01)

(58) Field of Classification Search
CPC ............... G01R 31/318536; G01R 31/318541; G01R 31/318572; G01R 31/318547; G01R 31/318575
USPC ............................ 714/726–731; 365/154, 205
See application file for complete search history.

(56) References Cited

U.S. PATENT DOCUMENTS

| | | | |
|---|---|---|---|
| 7,500,165 B2 * | 3/2009 | Guettaf | 714/731 |
| 2002/0083389 A1 * | 6/2002 | Grisenthwaite | 714/729 |
| 2004/0190331 A1 * | 9/2004 | Ross et al. | 365/154 |
| 2007/0016834 A1 * | 1/2007 | Debnath et al. | 714/726 |
| 2007/0245180 A1 * | 10/2007 | Li | 714/718 |
| 2008/0282122 A1 * | 11/2008 | Guettaf | 714/731 |
| 2008/0288842 A1 * | 11/2008 | Waayers et al. | 714/729 |
| 2012/0124423 A1 * | 5/2012 | Chakravadhanula et al. | 714/27 |
| 2012/0246528 A1 * | 9/2012 | Pugliesi-Conti | 714/726 |

* cited by examiner

*Primary Examiner* — Lincoln Donovan
*Assistant Examiner* — Thomas Skibinski
(74) *Attorney, Agent, or Firm* — McClure, Qualey & Rodack, LLP

(57) ABSTRACT

An isolation circuit includes a first multiplexer, a D flip-flop, a second multiplexer, an OR gate, and an AND gate. The first multiplexer selects a data signal or a scan-in signal as a first element output signal according to a scan enable signal. The D flip-flop generates a second element output signal according to the first element output signal. The second element output signal is fed back to the first multiplexer and is used as the data signal. The second multiplexer selects an isolation signal or the second element output signal as a third element output signal according to a test enable signal. The OR gate generates a fourth element output signal according to the scan enable signal and the third element output signal. The AND gate generates a second power domain signal according to a first power domain signal and the fourth element output signal.

14 Claims, 3 Drawing Sheets

ISOLATION CIRCUIT

CROSS REFERENCE TO RELATED APPLICATIONS

This Application claims priority of China Patent Application No. 201410151995.1 filed on Apr. 16, 2014, the entirety of which is incorporated by reference herein.

BACKGROUND OF THE INVENTION

1. Field of the Invention

The disclosure generally relates to an isolation circuit, and more particularly to an isolation circuit for improving its test performance.

2. Description of the Related Art

In a low-power system, inactive power domains are usually powered off, and therefore the power consumption of the system is reduced. For example, while a smartphone is performing a talk function, a power domain in which an LCD (Liquid Crystal Display) is located is temporarily powered off, and another power domain in which a communication module is located is continuously powered on, such that the power consumption of the smartphone is reduced.

An isolation cell is usually incorporated into the aforementioned low-power system, and it is configured to prevent the powered-on domains and the powered-off domains from interfering with each other. However, in specific applications, an isolation-signal input terminal of the isolation cell is tied to a predetermined voltage. Since the voltage at the isolation-signal input terminal is unchangeable, a system tester cannot determine whether the isolation cell is normal in all circumstances.

Accordingly, there is a need to design a flexible and high-performance isolation circuit of a test circuit for testing the isolation cell.

BRIEF SUMMARY OF THE INVENTION

To solve the problem in the prior art, in a preferred embodiment, the invention is directed to an isolation circuit, including: a first multiplexer, receiving a scan enable signal, a data signal, and a scan-in signal, wherein the first multiplexer selects the data signal or the scan-in signal as a first element output signal according to the scan enable signal; a D flip-flop, receiving the first element output signal and a clock signal, wherein the D flip-flip generates a second element output signal according to the first element output signal, and the second element output signal is fed back to the first multiplexer and is used as the data signal; a second multiplexer, receiving an isolation signal and the second element output signal, wherein the second multiplexer selects the isolation signal or the second element output signal as a third element output signal according to a test enable signal; an OR gate, receiving the scan enable signal and the third element output signal, wherein the OR gate generates a fourth element output signal according to the scan enable signal and the third element output signal; and an AND gate, receiving a first power domain signal and the fourth element output signal, wherein the AND gate generates a second power domain signal according to the first power domain signal and the fourth element output signal.

By using the test circuit and method of the invention, in the normal function mode of the isolation cell, the performance of the isolation cell is maintained. Furthermore, in the test mode of the isolation cell, it is more flexible to test multiple isolation cells by using mark-space-ratio-controllable test signals. Therefore, the invention can improve the test performance without changing the work mode of the isolation cell, i.e., without increasing the total cost and/or without increasing the number of circuit pins.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Figure 1:
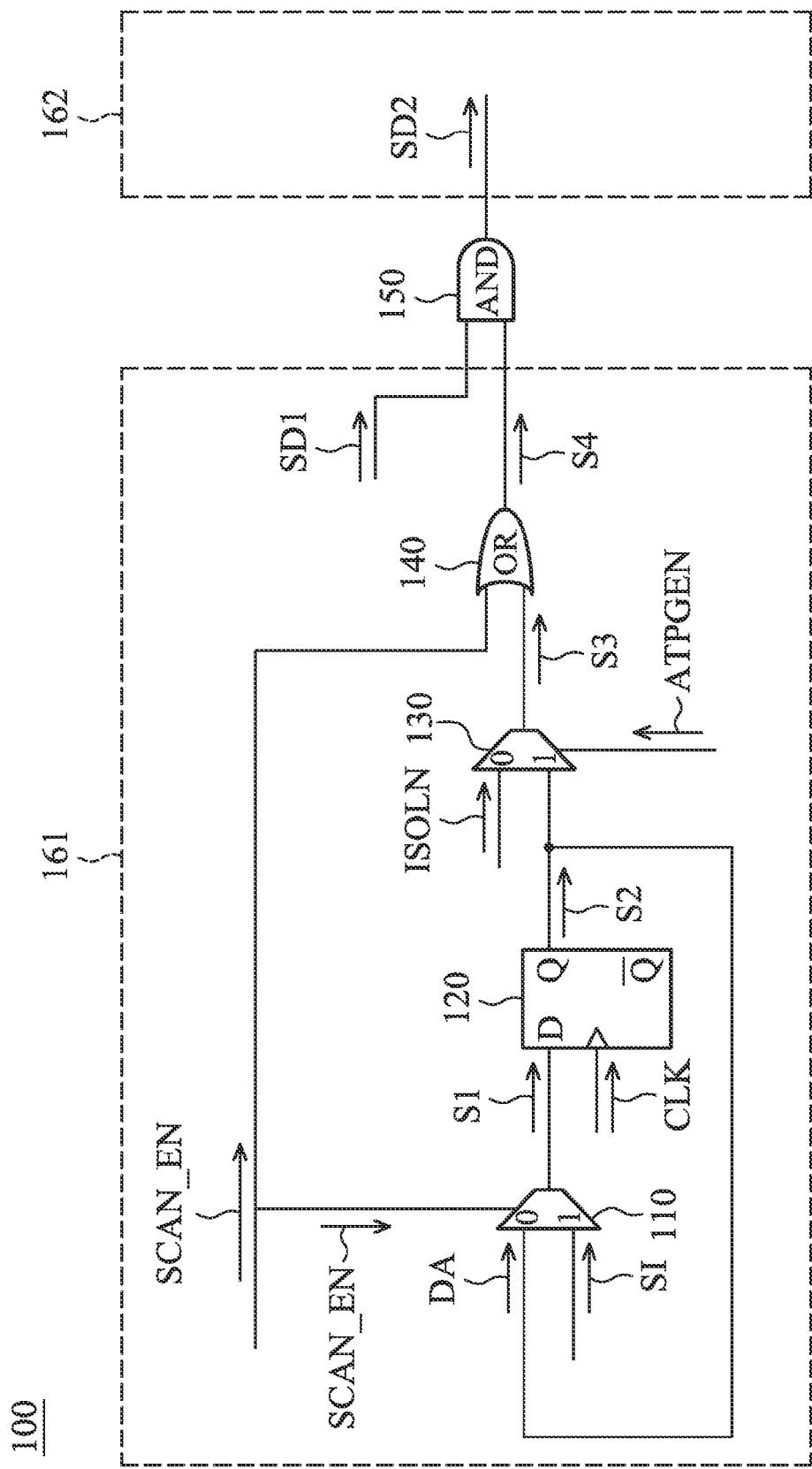
FIG. 1 is a diagram of an isolation circuit according to an embodiment of the invention.

FIG. 1 is a diagram of an isolation circuit (or an isolation cell) 100 according to an embodiment of the invention. The isolation circuit 100 may be applied to a mobile communication device, such as a smart phone, a tablet computer, or a notebook computer. As shown in FIG. 1, the isolation circuit 100 at least includes a first multiplexer (MUX) 110, a D flip-flop 120, a second multiplexer 130, an OR gate 140, and an AND gate 150.

The first multiplexer 110 receives a data signal DA and a scan-in signal SI, and selects either the data signal DA or the scan-in signal SI as a first element output signal S1 according to a scan enable signal SCAN_EN. For example, if the scan enable signal SCAN_EN is equal to a low logic level, i.e., a logic "0", the first multiplexer 110 may select the data signal DA as the first element output signal S1, and if the scan enable signal SCAN_EN is equal to a high logic level, i.e., a logic "1", the first multiplexer 110 may select the scan-in signal SI as the first element output signal S1.

The D flip-flop 120 has a data input terminal (D) for receiving the first element output signal S1, a clock input terminal for receiving a clock signal CLK, and a data output terminal (Q) for outputting a second element output signal S2. The second element output signal S2 is generated according to the clock signal CLK and the first element output signal S1. For example, after a positive trigger edge or a negative trigger edge of the clock signal CLK, hereinafter, the positive trigger edge and negative trigger edge may be called rising trigger edge and falling trigger edge. The second element output signal S2 is equivalent to the first element output signal S1. The second element output signal S2 is further fed back to the first multiplexer 110 and is used as the data signal DA. That is, the data signal DA is equivalent to the second element output signal S2.

The second multiplexer 130 receives an isolation signal ISOLN and the second element output signal S2, and selects either the isolation signal ISOLN or the second element output signal S2 as a third element output signal S3 according to a test enable signal ATPGEN. For example, if the test enable signal ATPGEN is equal to a low logic level, i.e., a logic "0", the second multiplexer 130 may select the isolation signal ISOLN as the third element output signal S3, and if the test enable signal ATPGEN is equal to a high logic level, i.e., a logic "1", the second multiplexer 130 may select the second element output signal S2 as the third element output signal S3.

The OR gate 140 receives the scan enable signal SCAN_EN and the third element output signal S3, and generates a fourth element output signal S4 according to the scan enable signal SCAN_EN and the third element output signal S3. For example, if any one of the scan enable signal SCAN_EN and the third element output signal S3 is equal to a high logic level, the fourth element output signal S4 may also be equal to a high logic level.

The AND gate 150 is configured as an isolation unit of the whole isolation circuit 100. The AND gate 150 receives a first power domain signal SD1 and the fourth element output signal S4, and generates a second power domain signal SD2 according to the first power domain signal SD1 and the fourth element output signal S4. For example, if any one of the first power domain signal SD1 and the fourth element output signal S4 is equal to a low logic level, the second power domain signal SD2 may be also equal to a low logic level. In some embodiments, the AND gate 150 is disposed between a first power domain 161 and a second power domain 162. The first power domain signal SD1 may be transmitted within the first power domain 161, and the second power domain signal SD2 may be transmitted within the second power domain 162. When the first power domain 161 is powered off and the second power domain 162 is powered on, the AND gate 150 can prevent signals of the first power domain 161 from interfering with the second power domain 162. For example, by appropriately controlling the scan enable signal SCAN_EN, the test enable signal ATPGEN, and the isolation signal ISOLN, the AND gate 150 of the isolation unit can selectively pass the first power domain signal SD1 to the second power domain 162, or block the first power domain signal SD1 from the second power domain 162, so as to achieve the isolation effect.

In some embodiments, the isolation circuit 100 selectively operates in a normal function mode, a shift mode of a test mode, or a capture mode of the test mode. More specifically, the test mode may be an ATPG (Automatic Test Pattern Generation) mode, which is used to test an integrated circuit chip. The operations of the above modes may be described in detail in the following truth table and embodiments.

TABLE I

Partial Truth Table of Isolation Circuit 100 in Different Modes

|  | SCAN_EN | ATPGEN | ISOLN | S4 | SD2 |
| --- | --- | --- | --- | --- | --- |
| Normal Function | 0 | 0 | 1 | 1 | SD1 |
| Mode | 0 | 0 | 0 | 0 | 0 |
| Shift Mode | 1 | 1 | 1 | 1 | SD1 |
|  | 1 | 1 | 0 | 1 | SD1 |
| Capture Mode | 0 | 1 | 1 | DA | SD1 or 0 |
|  | 0 | 1 | 0 | DA | SD1 or 0 |

Please refer to FIG. 1 and Table I together. When the isolation circuit 100 operates in the normal function mode, the scan enable signal SCAN_EN and the test enable signal ATPGEN are both set to a low logic level, such that the first element output signal S1 is equivalent to the data signal DA, and the third element output signal S3 is equivalent to the isolation signal ISOLN. When the isolation circuit 100 operates in the normal function mode and the isolation signal ISOLN is set to a high logic level, the fourth element output signal S4 outputted by the OR gate 140 is equal to a high logic level, and the second power domain signal SD2 outputted by the AND gate 150 is equivalent to the first power domain signal SD1, i.e., the AND gate 150 passes the first power domain signal SD1 to the second power domain 162. When the isolation circuit 100 operates in the normal function mode and the isolation signal ISOLN is set to a low logic level, the fourth element output signal S4 outputted by the OR gate 140 is equal to a low logic level, and the second power domain signal SD2 outputted by the AND gate 150 is clamped to a low logic level, i.e., the AND gate 150 blocks the first power domain signal SD1 from the second power domain 162. That is, in the normal function mode of the isolation circuit 100, the AND gate 150 serves as an isolation unit and has all general functions. The first power domain signal SD1 may be selectively passed or blocked by the AND gate 150 by appropriately setting the value of the isolation signal ISOLN.

When the isolation circuit 100 operates in the shift mode of the test mode, the scan enable signal SCAN_EN and the test enable signal ATPGEN are both set to a high logic level, such that the first element output signal S1 is equivalent to the scan-in signal SI, and the third element output signal S3 is equivalent to the second element output signal S2. In the shift mode, no matter which value the isolation signal ISOLN is set to, the second power domain signal SD2 outputted by the AND gate 150 is equivalent to the first power domain signal SD1. Therefore, one of ordinary skill in the art can understand that the isolation circuit 100 of the invention does not block the scan path of the isolation unit, i.e., the AND gate 150.

When the isolation circuit 100 operates in the capture mode of the test mode, the scan enable signal SCAN_EN is set to a low logic level, and the test enable signal ATPGEN is set to a high logic level, such that the first element output signal S1 is equivalent to the data signal DA, and the third element output signal S3 is equivalent to the second element output signal S2. In the capture mode, no matter which value the isolation signal ISOLN is set to, the fourth element output signal S4 outputted by the OR gate 140 is adjustable and is equivalent to the data signal DA, and the second power domain signal SD2 outputted by the AND gate 150 is equivalent to the first power domain signal SD1 or is clamped to a low logic level.

To be brief, when the isolation circuit 100 of the invention operates in the normal function mode, the AND gate 150 can selectively isolate the first power domain signal SD1 by controlling the isolation signal ISOLN, and when the isolation circuit 100 of the invention operates in the test mode, particularly in the capture mode, all pins of the AND gate 150 have adjustable voltages, rather than being tied to a fixed voltage. With such a design, a system tester can easily check the output signal of the AND gate 150 of the isolation circuit 100 according to the logic voltage levels at two pins of the AND gate 150. Therefore, it is easy to determine whether all functions of the AND gate 150 are normal and to maintain the good isolation performance. The AND gate 150 is a vital component, and if any pin of the AND gate 150 is tied to a fixed voltage, the tester cannot test the functions of the AND gate 150 completely. In the test mode, the AND gate 150 of the invention has input signal logic levels which are all controllable by the tester. As a result, the isolation circuit 100 of the invention has the advantages of both isolating different power domains and improving the test performance.

Figure 2:
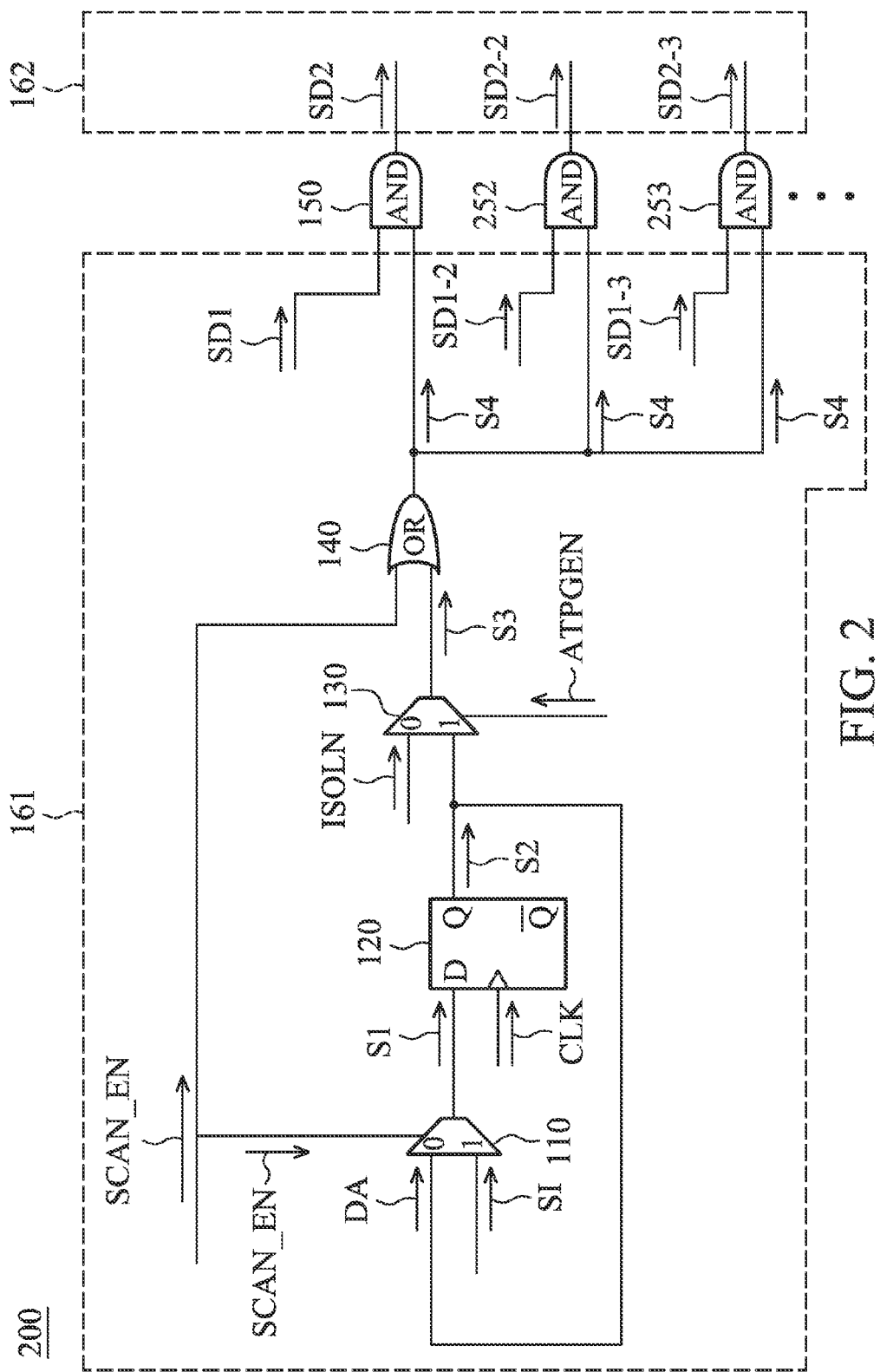
FIG. 2 is a diagram of an isolation circuit according to another embodiment of the invention.

FIG. 2 is a diagram of an isolation circuit 200 according to another embodiment of the invention. FIG. 2 is similar to FIG. 1. In the embodiment of FIG. 2, the isolation circuit 200 further includes one or more AND gates 252 and 253. That is, the isolation circuit 200 can control multiple AND gates 150, 252, and 253 concurrently. The AND gates 150, 252, and 253 are coupled in parallel between the first power domain 161 and the second power domain 162, and perform isolation functions to the modules connected thereto, respectively. The AND gates 150, 252, and 253 receive the fourth element output signal S4 and the first power domain signals SD1, SD1-2, and SD1-3, so as to generate the second power domain signals SD2, SD2-2, and SD2-3 according to the fourth element output signal S4 and the first power domain signals SD1, SD1-2, and SD1-3, respectively. Similarly, when the first power domain 161 is powered off and the different modules connected to the AND gates 150, 252, and 253 request to be powered off or powered on, the AND gates 150, 252, and 253 can prevent signals of the first power domain 161 from interfering with the modules connected to the AND gates 150, 252, and 253, according to the logic levels received by the AND gates 150, 252, and 253, respectively. Other features of the isolation circuit 200 of FIG. 2 are similar to those of the isolation circuit 100 of FIG. 1. As a result, the two embodiments can achieve similar levels of performance.

Figure 3:
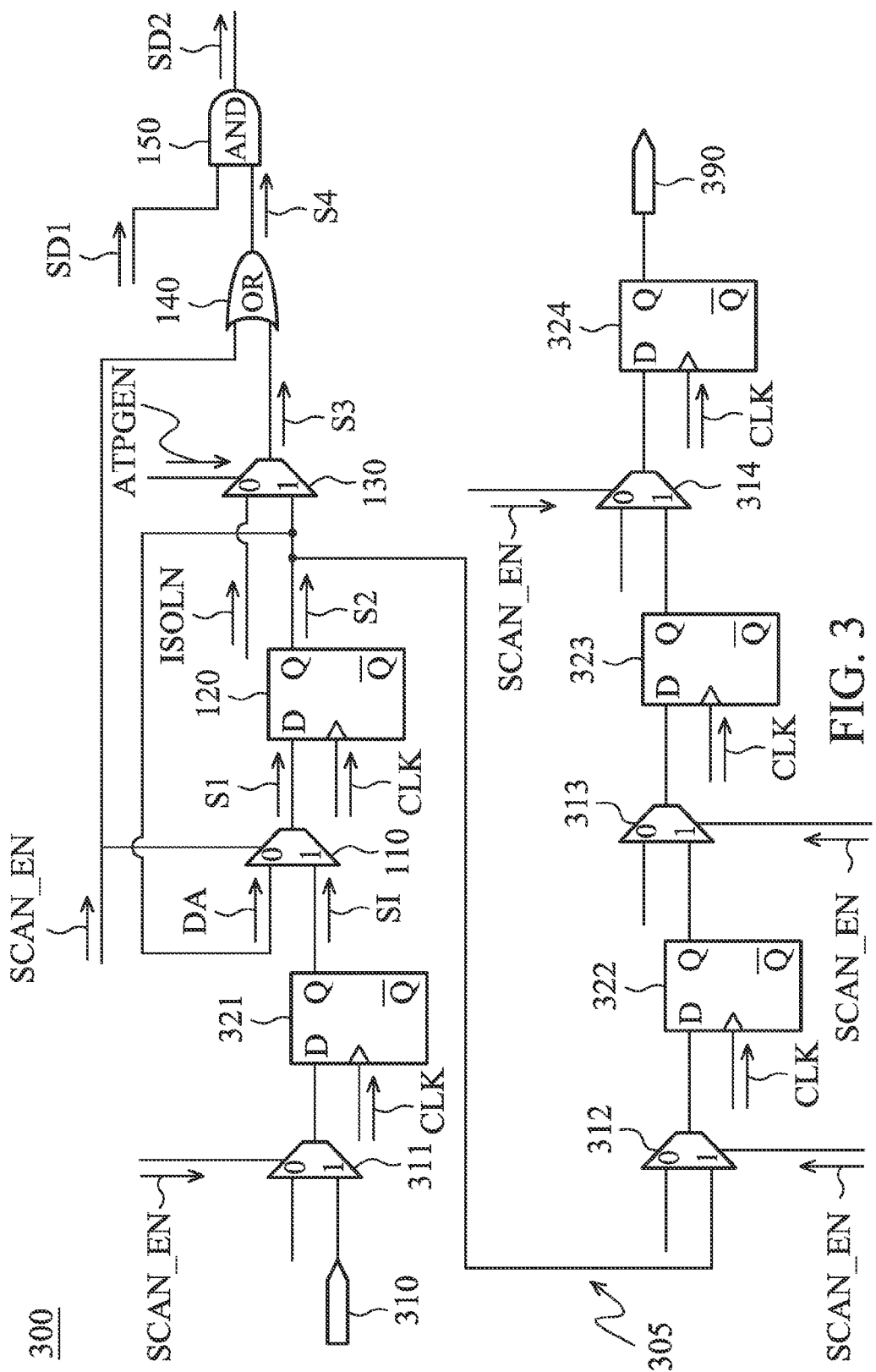
FIG. 3 is a diagram of an isolation circuit according to a further embodiment of the invention.

FIG. 3 is a diagram of an isolation circuit 300 according to a further embodiment of the invention. FIG. 3 is similar to FIG. 1. In the embodiment of FIG. 3, the isolation circuit 300 further includes a scan chain 305. The scan chain 305 has a scan input terminal 310 and a scan output terminal 390. The scan chain 305 includes multiple multiplexers 311, 110, 130, 312, 313, and 314, and multiple D flip-flops 321, 120, 322, 323, and 324. The multiplexers 311, 110, 130, 312, 313, and 314 are interleaved with the D flip-flops 321, 120, 322, 323, and 324. The multiplexers 311, 110, 130, 312, 313, and 314 and the D flip-flops 321, 120, 322, 323, and 324 are coupled in series between the scan input terminal 310 and the scan output terminal 390. In other words, the aforementioned first multiplexer 110 and the D flip-flop 120 are a portion of the scan chain 305. Among the scan chain 305, except for the initial and end portions thereof, the output terminal of each multiplexer is coupled to the data input terminal (D) of the corresponding next-stage D flip-flop, and the data output terminal (Q) of each D flip-flop is coupled to the scan-in signal (SI) input terminal of the corresponding next-stage multiplexer. When the isolation circuit 300 operates in the shift mode of the test mode, a digital signal may be transmitted from the scan input terminal 310 through the multiplexers 311, 110, 130, 312, 313, and 314 and the D flip-flops 321, 120, 322, 323, and 324 to the scan output terminal 390. That is, any portion of the scan chain 305 is not blocked. Other features of the isolation circuit 300 of FIG. 3 are similar to those of the isolation circuit 100 of FIG. 1. As a result, the two embodiments can achieve similar levels of performance.

The isolation circuit of the invention is not limited to the configurations of FIGS. 1-3. The invention may merely include any one or more features of any one or more embodiments of FIGS. 1-3. In other words, not all of the features shown in the figures should be implemented in the isolation circuit of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. An isolation circuit, comprising:
   a first multiplexer, receiving a scan enable signal, a data signal, and a scan-in signal, wherein the first multiplexer selects the data signal or the scan-in signal as a first element output signal according to the scan enable signal;
   a D flip-flop, receiving the first element output signal and a clock signal, wherein the D flip-flip generates a second element output signal according to the first element output signal, and the second element output signal is fed back to the first multiplexer and is used as the data signal;
   a second multiplexer, receiving an isolation signal and the second element output signal, wherein the second multiplexer selects the isolation signal or the second element output signal as a third element output signal according to a test enable signal;
   an OR gate, receiving the scan enable signal and the third element output signal, wherein the OR gate generates a fourth element output signal according to the scan enable signal and the third element output signal; and
   an AND gate, receiving a first power domain signal and the fourth element output signal, wherein the AND gate generates a second power domain signal according to the first power domain signal and the fourth element output signal.

2. The isolation circuit as claimed in claim 1, wherein the AND gate is disposed between a first power domain and a second power domain, and wherein when the first power domain is powered off and the second power domain is powered on, the AND gate prevents the first power domain from interfering with the second power domain, wherein the first power domain signal is generated from the first power domain.

3. The isolation circuit as claimed in claim 2, wherein the AND gate is a first AND gate, and wherein the isolation circuit further comprises:
   a plurality of second AND gates, coupled in parallel between the first power domain and the second power domain, and receiving the fourth element output signal, wherein when the first power domain is powered off and the second power domain is powered on, the second AND gates prevents the first power domain from interfering with the second power domain.

4. The isolation circuit as claimed in claim 1, wherein the isolation circuit operates in a normal function mode, a shift mode of a test mode, or a capture mode of the test mode.

5. The isolation circuit as claimed in claim 4, wherein the test mode is an Automatic Test Pattern Generation mode.

6. The isolation circuit as claimed in claim 4, wherein when the isolation circuit operates in the normal function mode, the scan enable signal and the test enable signal are both set to a low logic level, such that the first element output signal is equivalent to the data signal, and the third element output signal is equivalent to the isolation signal.

7. The isolation circuit as claimed in claim 4, wherein when the isolation circuit operates in the normal function mode and the isolation signal is set to a high logic level, the second power domain signal is equivalent to the first power domain signal.

8. The isolation circuit as claimed in claim 4, wherein when the isolation circuit operates in the normal function mode and the isolation signal is set to the low logic level, the second power domain signal is clamped to the low logic level.

9. The isolation circuit as claimed in claim 4, wherein when the isolation circuit operates in the shift mode of the test mode, the scan enable signal and the test enable signal are both set to a high logic level, such that the first element output signal is equivalent to the scan-in signal, and the third element output signal is equivalent to the second element output signal.

10. The isolation circuit as claimed in claim 4, wherein when the isolation circuit operates in the shift mode of the test mode, the second power domain signal is equivalent to the first power domain signal.

11. The isolation circuit as claimed in claim 4, wherein when the isolation circuit operates in the capture mode of the test mode, the scan enable signal is set to the low logic level, and the test enable signal is set to a high logic level, such that the first element output signal is equivalent to the data signal, and the third element output signal is equivalent to the second element output signal.

12. The isolation circuit as claimed in claim 4, wherein when the isolation circuit operates in the capture mode of the test mode, the fourth element output signal is adjustable and is equivalent to the data signal.

13. The isolation circuit as claimed in claim 4, further comprising:
  a scan chain, wherein the first multiplexer and the D flip-flop are a portion of the scan chain, and are disposed between a scan input terminal and a scan output terminal of the scan chain.

14. The isolation circuit as claimed in claim 4, wherein when the isolation circuit operates in the shift mode of the test mode, a digital signal is transmitted from the scan input terminal through the first multiplexer and the D flip-flop to the scan output terminal.

\* \* \* \* \*